United States Patent [19]
Jackson

[11] Patent Number: 5,241,285
[45] Date of Patent: Aug. 31, 1993

[54] PHASE LOCKED LOOP REFERENCE SLAVING CIRCUIT

[75] Inventor: Bruce R. Jackson, Santa Monica, Calif.

[73] Assignee: Apogee Electronics Corporation, Santa Monica, Calif.

[21] Appl. No.: 770,515

[22] Filed: Oct. 3, 1991

[51] Int. Cl.$^5$ ............... H03L 7/093; H03L 7/095
[52] U.S. Cl. .................... 331/1 A; 331/17; 331/27; 331/DIG. 2
[58] Field of Search ............ 331/1 A, 17, 25, 27, 331/DIG. 2

[56] References Cited

U.S. PATENT DOCUMENTS

| | | | |
|---|---|---|---|
| 3,993,958 | 11/1976 | Cutsogeorge | 331/17 X |
| 4,118,674 | 10/1978 | Ball | 331/17 |
| 4,774,480 | 9/1988 | Sato et al. | 331/1 A |
| 4,855,683 | 8/1989 | Troudet et al. | 328/15 J |
| 4,862,485 | 8/1989 | Guinea et al. | 375/120 |
| 4,928,075 | 5/1990 | Leis | 331/17 |
| 4,937,537 | 6/1990 | Nyqvist | 331/17 |
| 5,036,216 | 7/1991 | Hohmann et al. | 307/269 |
| 5,036,294 | 7/1991 | McCaslin | 331/1 A |

*Primary Examiner*—Siegfried H. Grimm
*Attorney, Agent, or Firm*—Robert J. Koch; Mark Ungerman

[57] ABSTRACT

A phase locked loop circuit may be utilized as a low jitter clock regenerator in order to generate an extremely stable low jitter signal which is to a large extent immune from input phase and frequency noise. The slaving clock generates an output at a fixed phase relationship to a reference input. The clock regenerator is advantageously implemented by a logic gate type phase detector connected to a multi-stage loop filter. The loop filter output is connected to a phase correction circuit whose output is mixed with the loop filter output to provide a control input to a voltage controlled oscillator. The voltage controlled oscillator output may be provided directly, or through a frequency divider, to a feed-back input of the phase detector.

22 Claims, 4 Drawing Sheets

PHASE LOCKED LOOP REFERENCE SLAVING CIRCUIT

BACKGROUND OF THE INVENTION

1. Field of the Invention

The invention relates to a phase locked loop circuit and more particularly to a reference slaving circuit that is particularly immune to reference signal jitter and maintains a constant phase relationship over a range of frequencies.

2. Description of the Related Technology

It is often necessary in communications, digital audio and many other applications to lock to an external clock or reference while generating a new clock source that is immune to various sources of phase and frequency noise in the incoming reference signal. This function can be accomplished utilizing phase locked loop techniques. A common method of generating a high frequency system clock from a low frequency reference signal is through the use of a phase locked loop circuit. There are various methods of implementing a phase locked loop circuit but all phase locked loop circuits have three central portions: a phase detector portion, a loop filter portion, and a voltage controlled oscillator portion. The phase detector portion has a first input for receiving a reference clock signal, and a second input for receiving feed-back from the output of the voltage controlled oscillator portion. The output of the voltage controlled oscillator portion is also the output signal of the phase locked loop circuit. The output of the phase detector portion is connected to an input of a loop filter. The loop filter operates as a low pass filter. The output of the loop filter is used to control the voltage controlled oscillator. A direct connection establishes a 1:1 phase locked loop. A connection through a frequency divider enables generation of frequency multiples.

The output of the phase detector portion provides a signal which is proportional to the phase difference between the reference signal and the feed-back signal. In response to the phase detector the loop filter portion provides an output signal that is a function of the input signal from the phase detector portion. The voltage controlled oscillator portion provides an output frequency that is proportional to the output of the loop filter. The feed-back from the voltage controlled oscillator to the phase detector is necessary to generate an output in phase lock with the input reference signal.

Depending on the application, each of the portions of the phase locked loop circuit is implemented using specific digital or analog circuits. There are tradeoffs between the characteristics of the various components when implemented using digital or analog circuits or when implemented by different types of components within the class of digital or within the class of analog components.

U.S. Pat. No. 5,036,294 entitled Phase Locked Loop having Low Frequency Jitter Compensation discusses some of these tradeoffs. Furthermore, available monolithic phase locked loop circuits offer multiple selectable components of varying types in order to allow an application designer to select desirable characteristics for a particular application.

SUMMARY OF THE INVENTION

It is an object of the invention to provide a digital phase locked loop circuit which provides a extremely low jitter output and is highly immune to input signal jitter. It is a further object that this module provide an output which maintains a constant phase relationship to the input even over a large range of input frequencies.

According to the invention a very pure output frequency with a very low jitter can be obtained even while slaving to a jittery reference. The module according to the invention and as described below has application in digital audio processing. It can be used as a slaving clock regeneration module as part of a digital to analog converter or in conjunction with an analog to digital conversion. The scope of the invention is not limited by these applications. The scope includes any type of PCM communication, data transmissions system or any application where a stable clock is slaved to a reference signal such as video graphics clock generation or FM transmission and reception systems.

Extremely stable clock signals are required for many applications particularly as the speed and accuracy of digital equipment such as A/D and D/A converters increases. Conventional clock regeneration techniques are barely adequate for 16 bit conversion performance and are not at all adequate for the new generation of 18 and 20 bit converters.

According to the invention, the module may be implemented with digital components. The clock regenerator, according to the invention, may be implemented using an exclusive OR phase detector that is normally unsuitable for the combined functions of constant phase lock versus frequency, and high phase noise immunity, such as a logic gate or exclusive OR type phase detector. The exclusive OR type phase detectors or their equivalent normally exhibit a very high tolerance of jitter but display varying phase shifts depending on reference signal frequencies. More conventional edge triggered phase detectors with three stage outputs are also inadequate. The edge triggered circuitry can lock with a set phase relationship and is not frequency dependent. These circuits, however, have the draw back that they are very sensitive to input jitter and exhibit a dead band when locked that will result in output signal jitter. According to the invention, a phase locked loop is implemented with a logic gate type phase detector and a long time constant phase lock servo which operates in conjunction with a shorter time constant loop control in order to lock both the phase and frequency into a predetermined relationship with the reference signal over a wide frequency range.

According to the invention, the clock regenerator may include a logic gate type phase detector responsive to a reference input signal and a feed-back input. A loop filter may be connected to an output of a phase detector. A phase shift correction circuit may be connected to the loop filter. A voltage controlled oscillator is connected to the loop filter and the phase shift correction circuit and an output of the voltage controlled oscillator is advantageously connected to the feed-back input of the phase shift detector. A signal combining circuit may be arranged to mix the outputs of the loop filter and phase shift correction circuit to be used as an input for the voltage controlled oscillator.

According to an advantageous embodiment, the loop filter may be made up of a first fast loop filter which is utilized to rapidly bring the loop signal into a predetermined range and a second slow loop filter which is particularly suited to fine tune and lock the frequency. Advantageously a diode set is arranged between the two loop filters in order to control and speed their operation.

According to the invention the logic gate type phase detector is advantageously an exclusive OR type detector. Equivalent phase detectors may be utilized. The most significant characteristic of the phase detector is that it be, to a large degree, immune to input circuit jitter and that it does not exhibit any significant dead band in the operating range. The phase detector may also be provided with frequency divider input stages. The frequency divider input stages may be utilized to provide the logic gate with 50% duty cycle inputs. The frequency divider input stages may advantageously be implemented by D type flipflops configured as divide by two circuits.

According to the invention the phase correction circuit is a very slow time constant circuit which will operate to set the phase relationship between the reference signal and the output of the voltage controlled oscillator. The phase shift correction circuit or servo performs its appointed function while the loop filters operate in order to lock the frequency relationship. The phase shift correction circuit may be implemented as a passive filter or more advantageously as an active filter in the form of an integrator. One of the inputs to the preferred integrator circuit is a reference voltage input. The reference voltage operates in order to set the phase relationship. This reference voltage may be adjusted in order to shift the phase relationship between the reference signal and the stabilized output.

According to another feature, one or more frequency dividers may be provided in the feed-back path between the output of the voltage controlled oscillator and the feed-back input of the phase detector. The frequency divider allows for the generation of signals which are frequency multiples of the reference signals. According to the preferred embodiment two sets of frequency multiple dividers may be provided. The sets may be selectable. The first divider set may provide frequency multiples of 768, 384, 256, 128, 64, 32, 16, 8, 4, 2, 1 and 1/2. The second set can provide frequency multiples of 384, 192, 96, 48, 24, 12, 6, 3, 1.5 and 1.

According to the invention the method of stabilizing a reference signal includes the steps of detecting a phase difference between a reference signal and an output signal using a jitter tolerant phase detector. The output of the phase detector can be adjusted by a series of controls and is used to drive a voltage controlled oscillator to generate an output signal. The series of controls includes the steps of applying a rapid frequency control to bring the output frequency within a predetermined relationship to the reference signal. Applying a slow or fine frequency control in order to minimize any frequency jitter or shift and applying a very slow servo control in order to adjust the phase relationship between the reference signal and an output signal.

According to a further advantageous modification of the invention, a lock detect window output signal may be provided. The lock detect window signal indicates when the phase relationship between the reference signal and the stabilized output signal falls within a predetermined range. The window may track any phase offset created by the phase correction circuit. According to an advantageous embodiment, the reference voltage utilized to set the phase relationship may be utilized as the center of the lock window. A current source may be connected to the reference voltage in order to set the upper limit of the lock window. A differential inverter connected to the reference voltage and the current source output advantageously establishes the lower limit of the lock window. A dual comparator circuit connected on the one hand to the output of the loop filters and on the other hand to the upper and lower limits of the lock window can provide an output indicative of whether the output of the loop filter falls within the lock detect window.

Further aspects of the invention are described in connection with the detailed description of the preferred embodiment and are set forth in the claims. The scope of the invention is not intended to be limited by the preferred embodiment.

DETAILED DESCRIPTION OF THE PREFERRED EMBODIMENT

Figure 1:
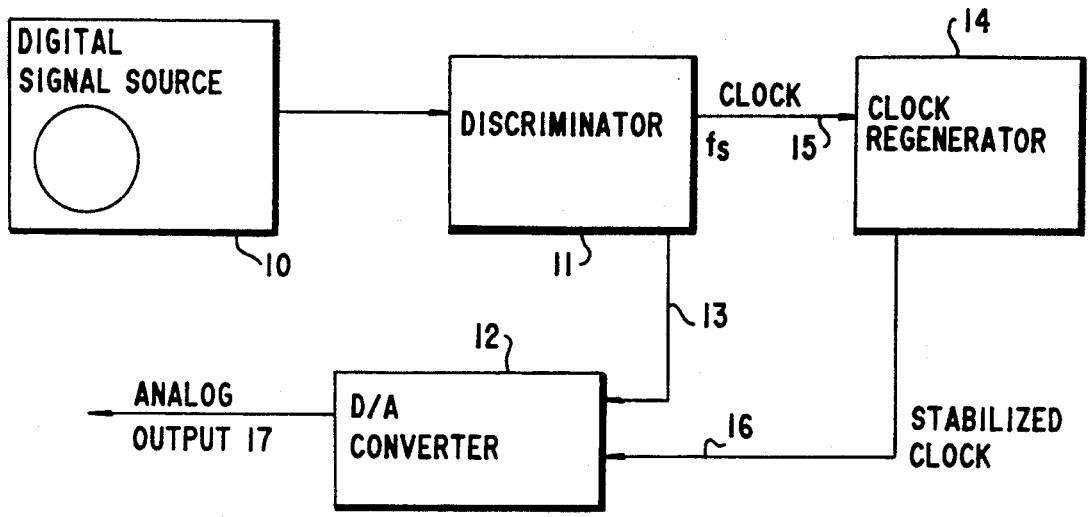
FIG. 1 shows a representative application for the regenerator according to the invention.
Figure 2:
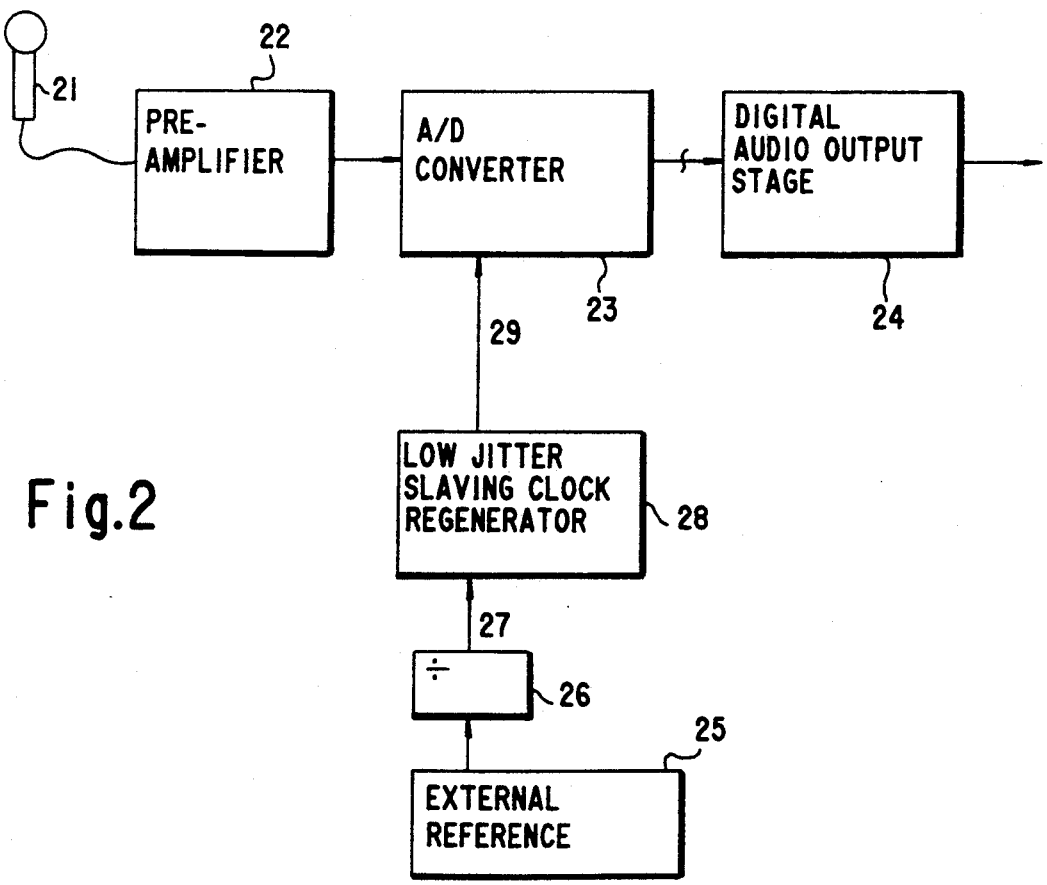
FIG. 2 shows an alternative application for the regenerator according to the invention.

FIG. 1 shows a representative application for a phase stabilized low jitter slaving clock. FIG. 1 represents typical digital to analog conversion application. A digital signal source 10, such as a CD player, is illustrated. Any type of digital signal source which needs to be converted to an analog output may be used. According to the illustrated embodiment, the output of the CD drive may be a PCM signal or signal with data and an embedded clock pulse. The typical CD output is 44,100 Hz. This output signal is transmitted to a discriminator 11 which separates out the data and the timing signals. The data signal is transmitted directly to the digital to analog converter 12 over data line 13 and the timing signals are transmitted to a clock regenerator or phase locked loop 14 over timing line 15. Typically the timing signals will exhibit an unacceptable jitter which will be locked by the clock regenerator 14. A stabilized clock signal is transmitted over line 16 to the D/A converter 12. An analog output 17 is provided by the D/A converter. FIG. 2 shows an alternative application for use with an analog to digital converter. A typical environment for this application may be in digital recording where the analog source may be a microphone or analog instrument. This type of circuit has applications for a broad range of analog to digital conversion as far ranging as seismic monitoring and sonar or radar applications. Microphone 21 and preamplifier 22 represent any analog source. Other sources may be seismic sensors, antennas, etc. The analog source is provided to an analog to digital converter 23. A digital output is provided from the analog to digital converter through a digital output stage 24. This digital output may then be used to digitally process the information or store information in a retrieval system such as a computer memory, magnetic tape, or a CD system. The timing signals for the analog to digital converter may be provided by any outside source such as a crystal oscillator. Other external sources may be provided such as a timing signal from video equipment or some other related equipment. The output of an external reference may advantageously be provided through a divider circuit 26 in order to equalize the reference signal duty cycle. A reference signal may be provided over line 27 to a low jitter slaving clock regenerator 28. The clock regenerator 28 will provide an extremely stable and accurate timing signal to the analog to digital converter over line 29.

Figure 3:
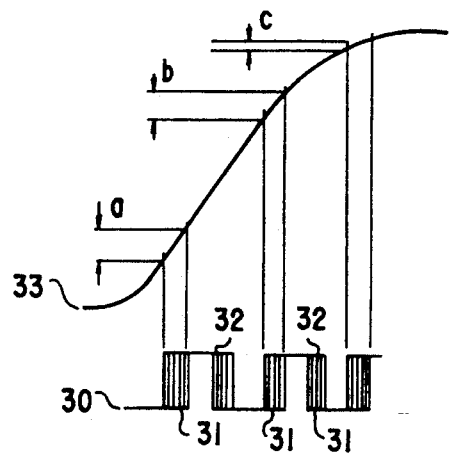
FIG. 3 illustrates the importance of a stabilized clock in conversion applications.

FIG. 3 is a graphical illustration showing the importance of a stabilized clock signal in conversion applications. Timing signal 30 represents a jittery timing signal. The shading on the leading edges 31 and trailing edges 32 represents the range of uncertainty in the timing of the signal 30. In a conversion application, this uncertainty in the timing of the analog sampling or digital to analog generation can result in an error range a, b, and c in the conversion or generation of a signal 33. These errors can be greater than any advantage obtained by using an accurate converter. In order to obtain the advantages available from the use of the generation of 18 or 20 bit converters, a very stable timing signal is required.

Figure 4:
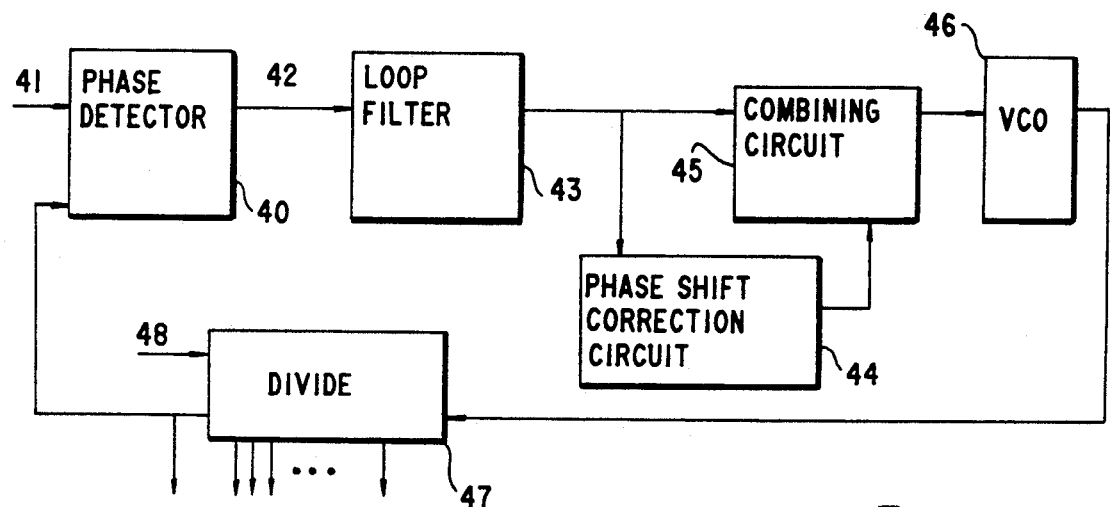
FIG. 4 shows a clock regenerator according to the invention.

FIG. 4 shows a clock regenerator circuit according to the invention. A reference signal is provided to the phase detector 40 over a reference input 41. The phase detector output 42 is provided to a loop filter 43. The loop filter generally acts as a low pass filter. The loop filter output is provided to a phase shift correction circuit 44. The phase shift correction circuit may be a servo, such as an integrator circuit or another very slow time constant filter. The loop filter and servo are appropriately damped. The outputs of the loop filter 43 and phase shift correction circuit 44 are combined or mixed by the combining circuit 45 which may be implemented by a differential amplifier. The output of the combining circuit is a control input to the voltage controlled oscillator 46. The output of the voltage controlled oscillator is provided through a divider circuit 47 to the feed-back input of the phase detector 40. The divider 47 may advantageously provide one or more series of multiple frequency outputs. The desired series of frequency outputs may be selected by a control input 48. The frequency divider 47 is provided in a feed-back loop and operates to multiply the frequency of the output. According to the preferred embodiment, the output frequency may be multiplied by up to 768 times the input frequency. Furthermore, the series of dividers can provide a plurality of signals all locked in phase and frequency relationship.

Figure 5:
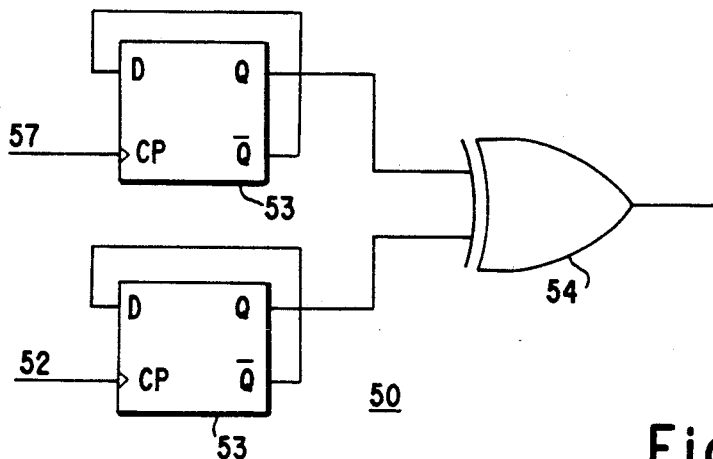
FIG. 5 shows a phase detector.

FIG. 5 is a schematic of a logic gate type phase detector 50. The phase detector has a reference input 51 and a feed-back input 52. According to an advantageous embodiment the inputs may be provided with frequency dividers 53 which may advantageously be implemented by D-type flipflops. The output of the frequency dividers 53 are then provided to a phase detector 54. The phase detector 54 may simply be an exclusive OR logic gate or some other equivalent circuitry.

Figure 6:
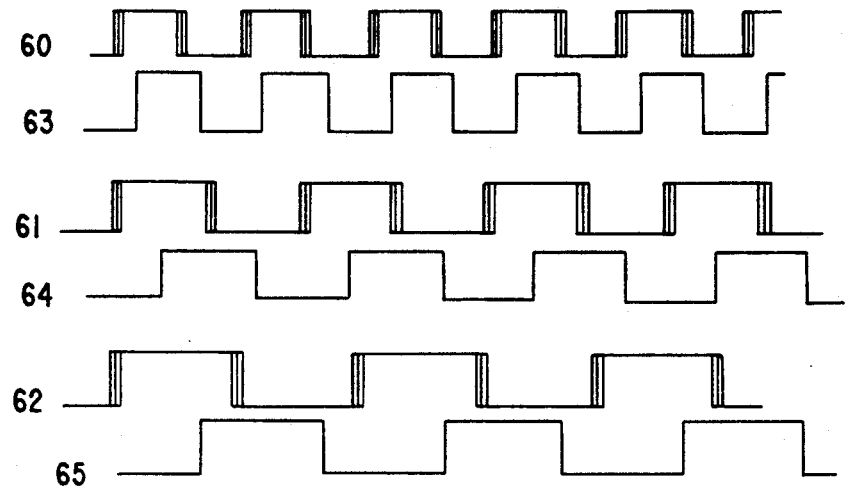
FIG. 6 shows schematic phase shifts of frequency regeneration which is not phase stabilized.

One of the drawbacks involved in the utilization of a logic gate type phase comparator is that the phase shift of a regenerator circuit utilizing this type of comparator will vary depending on frequency. FIG. 6 shows three typical audio application, frequency reference signals 60, 61 and 62. As can be seen from the illustration, each of the signals may include an uncertainty or jitter at both the leading and trailing edges. A frequency stabilized output signal 63, 64, 65 may exhibit differing phase lags at different frequencies. This inherent drawback in logic gate type phase detectors has limited their applicability.

Figure 7:
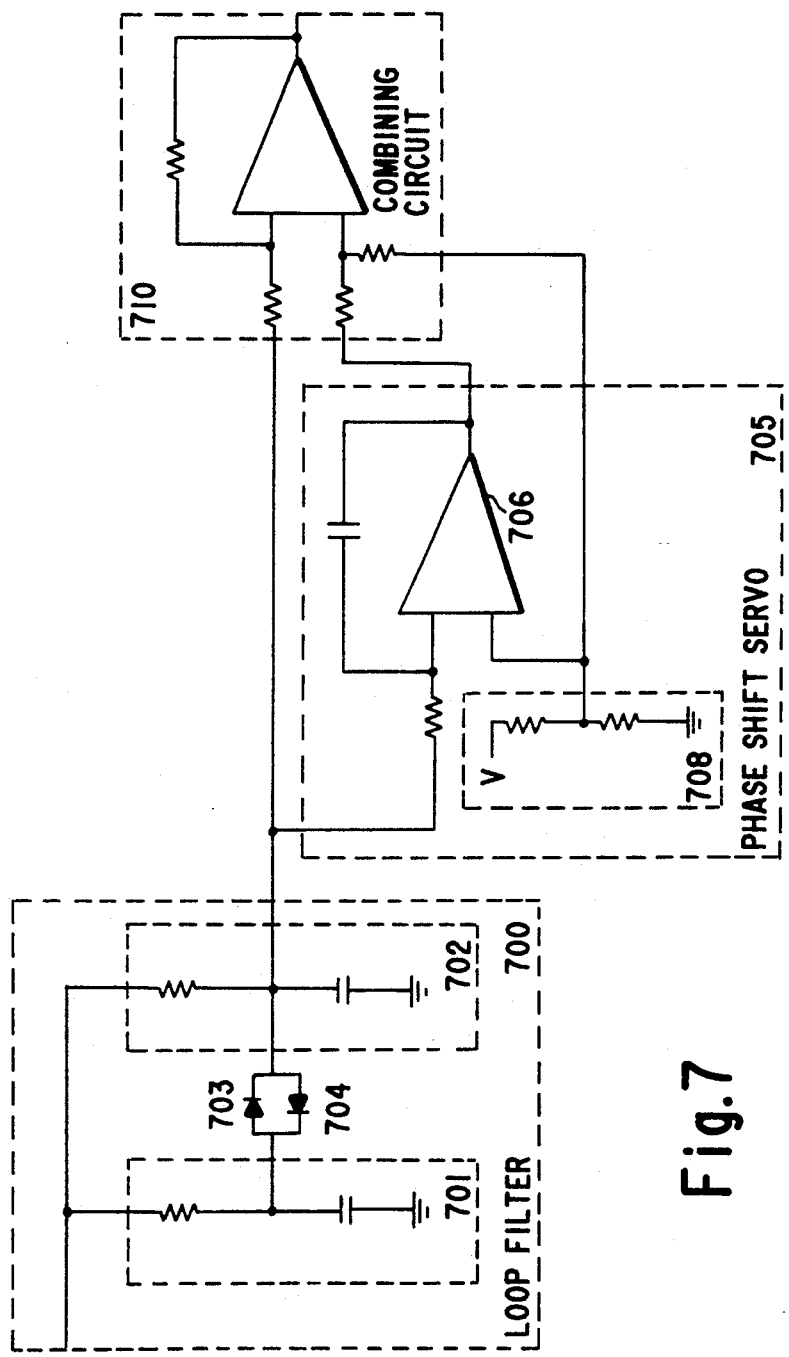
FIG. 7 shows a control segment of a clock regenerator according to the invention.

According to the invention, this drawback is overcome by the introduction of the phase shift correction circuit 44. FIG. 7 shows a preferred embodiment of a portion of the invention where the loop filter 700 is implemented by a fast loop filter 701 and a slow loop filter 702. The fast loop filter operates to bring the frequency rapidly within a predetermined range and the slow loop filter operates to lock the frequency at the desired level. The fast loop filter is connected to the slow loop filter through diodes 703 and 704. Advantageously the fast loop filter may be implemented by an RC network having a very fast time constant while the slow loop filter is implemented by a RC network having a slower time constant. The loop filters may be buffered using simple impedance buffers. The loop filter output is provided to the phase shift servo 705. The servo may be implemented by an operational amplifier 706 based integrator circuit. In order to adjust the degree of phase shift a reference source 708 may be connected to the integrator 707. The reference advantageously is a variable reference.

When a 50% duty cycle signal is presented to the loop filter input in a locked condition, the system will have a 180° phase relationship between the rising edge of the reference and the rising edge of the feed-back input. If the voltage V shown in the phase shift servo reference is appropriately initialized, then V/2 will result in a 180° phase shift. The 180° locked relationship is therefore established at V/2 when V is the maximum voltage output of the phase detector. If the voltage is increased by V/360, the phase relationship shifts by one degree. The phase shift servo circuit operates to servo the phase relationship, at lock, to a point determined by the voltage divider across V as shown at the reference source 708.

The output of the phase shift servo 705 and loop filter 700 may be mixed using a combining circuit 710. The combining circuit 710 may advantageously be implemented by a differential amplifier.

Figure 8:
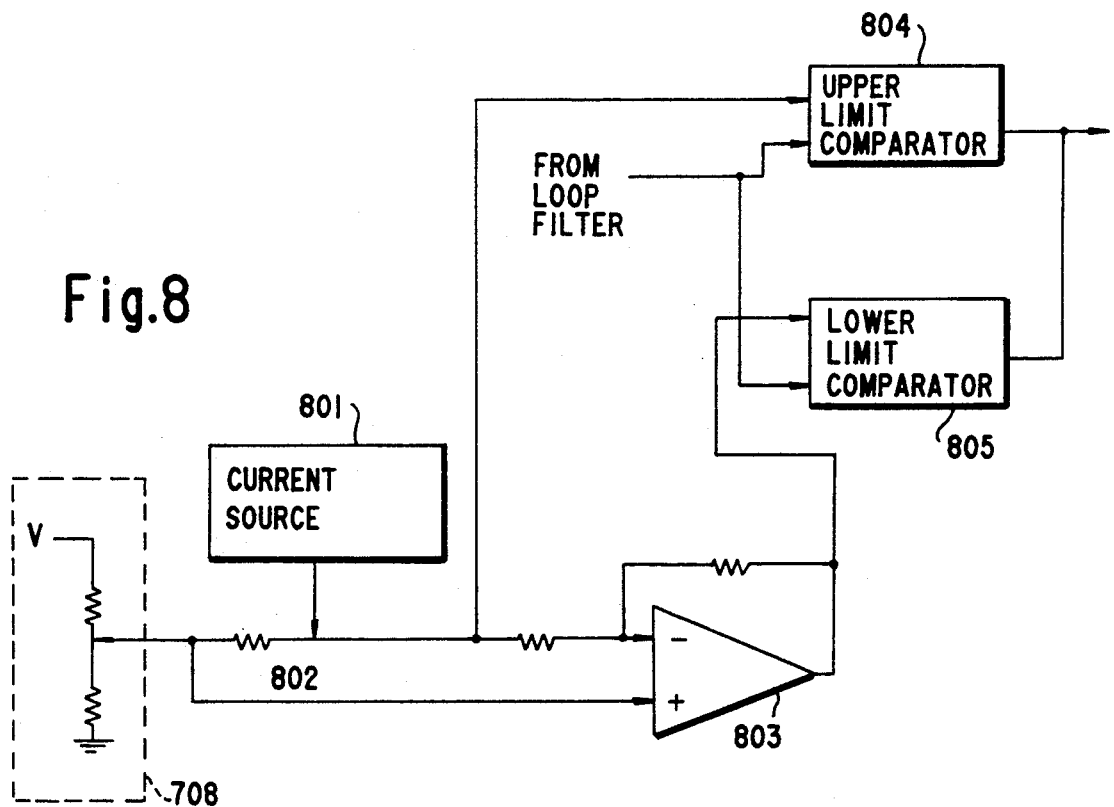
FIG. 8 shows a lock detect window circuit.

FIG. 8 shows a lock detect window indication circuit. This circuit uses the same divided reference 708 as is utilized by the phase shift servo 705. A current source 801 is utilized to add a predetermined voltage and set the lock window around the desired phase relationship. The current source 801 will always add a constant voltage to the divided reference 708. The constant voltage is the current provided by source 801 times the resistance of resistor 802. An inverter 803 generates a reciprocal voltage which is utilized to set the lower limit of the phase lock detect window. An upper limit comparator 804 and lower limit comparator 805 may advantageously be utilized to provide an output indicative of whether the loop filter output is within a predetermined phase relationship window.

It will be appreciated that the invention is illustrated by way of the example. The spirit and scope of the invention is not intended to be limited by the description of the preferred embodiment. Those of ordinary skill in the art will recognize that various modifications may be made while remaining within the spirit and scope of the claims.

What I claim is:

1. A clock regenerator comprising:

a logic gate type phase detector responsive to an input signal and a feed-back input;

a loop filter connected to an output of said phase detector;

a phase relation setting circuit connected to said loop filter;

a voltage controlled oscillator connected to said loop filter and said phase relation setting circuit, wherein an output of said voltage controlled oscillator is connected to said feed-back input of said phase detector.

2. A clock regenerator according to claim 1 further comprising:

a signal combining circuit connected to an output of said loop filter, an output of said phase relation setting circuit and an input of said voltage controlled oscillator.

3. A clock regenerator according to claim 2 wherein said loop filter comprises:

a fast loop filter and a slow loop filter each connected to said phase detector.

4. A clock regenerator according to claim 3 wherein said loop filter further comprises a diode set connected between said fast loop filter and said slow loop filter.

5. A clock regenerator according to claim 3 wherein said logic gate type phase detector is an exclusive or type phase detector.

6. A clock regenerator according to claim 3 wherein said phase detector further comprises a first divide by two stage connected to said input signal.

7. A clock regenerator according to claim 6 wherein said phase detector further comprises a second divide by two stage connected to said feed-back input.

8. A clock regenerator according to claim 7 wherein said first divide by two stage and said second divide by two stage comprise D-type flipflops.

9. A clock regenerator according to claim 3 wherein said phase relation setting circuit comprises an integrator.

10. A clock regenerator according to claim 3 wherein said phase relation setting circuit is a variable phase shift correction circuit.

11. A clock regenerator according to claim 3 wherein said phase relation setting circuit is configured to set a phase shift correlated to a reference.

12. A clock regenerator according to claim 11 wherein said reference is an adjustable reference.

13. A clock regenerator according to claim 3 further comprising a frequency divider connected between said voltage controlled oscillator and said feed-back input of said phase detector.

14. A clock regenerator according to claim 13 wherein said frequency divider further comprises a first set of frequency multiple divider stages.

15. A clock regenerator according to claim 14 wherein said frequency divider further comprises:

a second set of frequency multiple divider stages; and a divider set selector connected to said first set and said second set.

16. A clock regenerator comprising:

a jitter tolerant means for detecting phase differences between two inputs;

a loop filter means, connected to an output of said means for detecting phase differences, for locking a frequency relationship between an output signal and a reference signal;

means, connected to said loop filter means, for setting a frequency independent phase relationship between said reference signal and said output signal;

a voltage controlled oscillator connected to said loop filter means and said means for setting a frequency independent phase relationship, wherein an output of said voltage controlled oscillator is connected to an input of said means for detecting phase differences.

17. A clock regenerator according to claim 16 wherein said loop filter means comprises:

a fast loop filter means for rapidly bringing the frequency into range and a slow loop filter means for maintaining an accurate frequency relationship between said reference and output signals.

18. A clock regenerator according to claim 17 wherein said means for detecting phase differences further comprises means for dividing input signal frequencies.

19. A clock regenerator according to claim 17 wherein said means for setting a frequency independent phase relationship comprises an integrator.

20. A clock regenerator according to claim 19 wherein said means for setting a frequency independent phase relationship is variable.

21. A clock regenerator according to claim 17 further comprising a frequency divider connected to an output of said voltage controlled oscillator.

22. A method of stabilizing an output signal comprising the steps of:

detecting a phase difference between a reference signal and an output signal using a jitter tolerant phase detector;

applying a rapid frequency control to an output signal of said phase detector in order to bring frequency within a predetermined range;

applying a fine frequency control to said output signal of said phase detector in order to minimize any frequency jitter;

applying a servo control to an output signal of said frequency controls in order to adjust the phase relationship between the reference signal and the output signal, induced by said phase detector;

generating said output signal in response to said controls.

* * * * *